United States Patent [19]

Blais

[11] Patent Number: 4,819,197
[45] Date of Patent: Apr. 4, 1989

[54] PEAK DETECTOR AND IMAGING SYSTEM

[75] Inventor: Francois Blais, Vanier, Canada

[73] Assignee: Canadian Patents and Development Limited-Societe Canadienne Des Brevets Et D'Exploitation Limitee, Ottawa, Canada

[21] Appl. No.: 103,382

[22] Filed: Oct. 1, 1987

[51] Int. Cl.$^4$ .......................... G06F 7/38; H01J 40/14
[52] U.S. Cl. .......................... 364/715.06; 250/214 DC
[58] Field of Search .............. 364/560, 561, 562, 563, 364/564, 572, 577, 715, 723, 724, 732; 358/3, 88, 107; 250/201, 209, 214 DC, 558; 356/376

[56] References Cited

U.S. PATENT DOCUMENTS

| 4,394,683 | 7/1983 | Liptay-Wagner et al. | 358/107 |
| 4,645,347 | 2/1987 | Rioux | 356/376 |
| 4,658,358 | 4/1987 | Blais | 364/572 |

OTHER PUBLICATIONS

Blais et al., "Real-Time Numerical Peak Detector" *Signal Processing*, vol. 11, No. 2, Sep. 1986, pp. 145-155.
Rioux, M. et al., "Compact Three-Dimensional Camera for Robotic Applications" *J. Opt. Soc. Am. A.*, vol. 3, No. 9, Sep. 1986, pp. 1518-1521.
Blais, F. et al., "Optics, Illumination, and Image Sensing for Machine Vision-BIRIS: A Single 3D Sensor" *Proceedings of SPIE International Society for Optical Engineering*, vol. 728, 1986.

Primary Examiner—Eugene R. LaRoche
Assistant Examiner—David Mis

[57] ABSTRACT

A circuit for detecting the positions and intensities of peaks in a digital input signal (which may be a digitized version of a signal from a CCD forming part of a three dimensional imaging device) employs a second derivative of the input signal for validating the presence of each input peak. Each validation signal enables an interpolation circuit that determines the position of a peak by finding the location of a zero crossing point of a first derivative of the input signal. Each validation signal also enables a maximum detector for measuring the intensity of each peak. The arrangement does not require resetting after each detection of a peak and is less sensitive than prior devices to noise or DC or low frequency components.

18 Claims, 4 Drawing Sheets

PEAK DETECTOR AND IMAGING SYSTEM

FIELD OF THE INVENTION

This invention relates to an improved peak position detector for electrical signals, and more particularly to one capable of detecting the positions of multiple peaks in a signal. The detector may also detect the intensities of such peaks.

The invention also relates to an imaging system incorporating a peak position detector.

PRIOR ART

In my U.S. Pat. No. 4,658,368 issued Apr. 14, 1987, the contents of which are hereby incorporated herein by reference, there is disclosed a detector in which the position of a peak in a digital signal is determined by a circuit consisting of a finite impulse response (FIR) filter constructed in accordance with either the expression $(1+z^{-1}) (1+z^{-2}) (1-z^{-5})$ or the expression $(1+z^{-1}) (1-z^{-3})$, where z is the z transform function and the index indicates the number of clock intervals in each delay. The practical realisation of each filter for applying these expressions to an input signal employs three delay circuits in series for the first expression (a so-called 8th order FIR filter), or two delay circuits in series for the second expression (a so-called 4th order FIR filter). In either case the output of the filter is a differentiated signal, the zero crossing point of which represents the desired peak position. This crossing point is detected by an interpolation circuit that linearly interpolates the location of such point to a fraction of a clock interval or pixel.

This prior detector had a gain of approximately five in precision and speed over prior conventional methods, but nevertheless required resetting after each detection of the position of one peak.

SUMMARY OF THE INVENTION

An object of the present invention is to provide an improved peak position detector that can detect the positions of a number of peaks in a digital input signal without requiring resetting between each such detection.

A further object is to provide an improved peak position detector that is less sensitive to noise or to other ambient conditions such as DC or low frequency components in the input signal, and yet can accommodate a wide fluctuation in the intensities of the detected peaks.

This object is achieved according to the invention by generating a second derivative of the input signal, wherein the position of each peak in the input signal is represented by a further peak, and using this second derivative signal to generate a validation signal when the absolute value of the further peak exceeds a threshold value. The interpolation circuit, which determines the position of each peak of the input signal, continues to receive the first derivative signal, as in my prior patent, and still makes this determination on the basis of a zero crossing of the first derivative signal. However, in accordance with the present invention, such interpolation circuit is now enabled by a validation signal that has been obtained from the second derivative signal.

In the preferred embodiment of the invention, the detector also includes a maximum detector for generating an output representing the amplitude (intensity) of each peak of the input signal.

The invention also relates to a three dimensional imaging system incorporating a peak position and intensity detector.

DETAILED DESCRIPTION OF THE PREFERRED EMBODIMENTS

Figure 1:
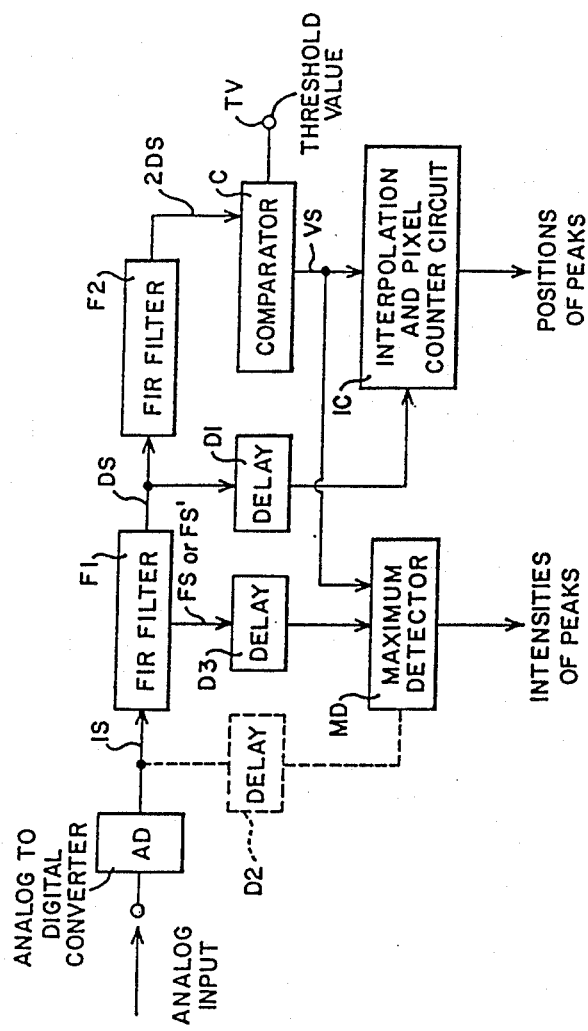
FIG. 1 is a circuit diagram of an embodiment of a peak position detector according to the present invention.

Referring to FIG. 1, an analog input signal, e.g. from a CCD, is converted in an analog-to-digital converter AD to a digital input signal IS which enters a first FIR filter F1. This can be either a 4th or an 8th order filter such as described in detail in my prior patent referred to above. The outputs from the filter F1 are a differentiated (first derivative) signal DS and a filtered signal FS or FS'. The prior patent explains the distinction between signals FS and FS'. The signal DS is passed to a second FIR filter F2 connected in cascade with the filter F1 and which likewise can be either a 4th or an 8th order filter, to generate a second derivative signal 2DS.

Figure 2:
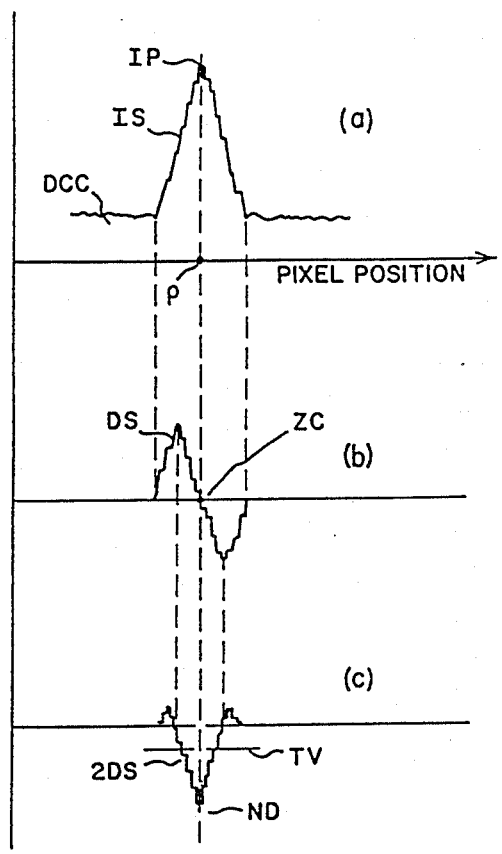
FIG. 2 is a graphical representation of signals in the circuit of FIG. 1.

In FIG. 2 parts (a), (b) and (c) respectively illustrate signals IS, DS and 2DS for a single positive, input peak IP in the signal IS, which peak IP is assumed to occur at a pixel position P. It will be noted that the first derivative signal DS identifies the position of this input peak IP by a zero crossing ZC at pixel position P, whereas the second derivative signal 2DS identifies this peak IP by means of a negative peak NP, also at pixel position P.

Referring again to FIG. 1, the second derivative signal 2DS is passed to a comparator C where it is compared with a threshold value TV. Whenever the absolute value of the peak NP exceeds the absolute value TV (i.e. without regard to the negative sign), the existence of the input peak IP is validated. The comparator C then emits a validation signal VS. Validation in this manner avoids false indications due to noise or to any DC (or low frequency) component DCC present in the input signal IS. As in my prior patent, the exact pixel position of the peak IP can be determined from the zero crossing point data that is contained in the first derivative signal DS. This determination is made by an interpolation and pixel counter circuit IC that is enabled by the validation signal VS from the comparator C, a delay D1 being interposed in the signal DS to compensate for the delay in the filter F2. The manner in which the circuit IC can operate to output the peak position data has been explained in my prior patent.

The validation signal VS can also be passed to a maximum detector MD to enable the same. The detector MD determines the intensity of the peak either directly from the input signal IS (broken lines) or preferably from the filtered signal FS or FS', subject to an appropriate delay D2 or D3, as the case may be.

The interpolation circuit IC is automatically effectively reset as soon as each validation signal VS disappears, i.e. when the signal 2DS again falls below (in absolute value terms) the threshold value TV. The system is thus immediately ready to process and detect a second incoming peak without need for any other form of resetting.

While the circuit of FIG. 1 operates in the same manner as in my prior patent in that the intensities and the positions of the peaks continue to be derived respectively from the FS (or IS or FS') and the DS signals, the operation differs from that of my prior patent in that the peak validation signal is now obtained from the second derivative signal 2DS instead of from the input signal IS (or its filtered equivalent FS or FS'). This new way of achieving validation avoids the problem of setting the intensity threshold at a value that is low enough to detect small peaks while nevertheless eliminating noise. The new arrangement also enables a multiplicity of peaks to be detected per scan without resetting, and it is less sensitive to ambient conditions, e.g. noise or DC or low frequency components. The new arrangement can accommodate a wide fluctuation in the intensities of the peaks, enabling small peaks not to be missed.

Figure 3:
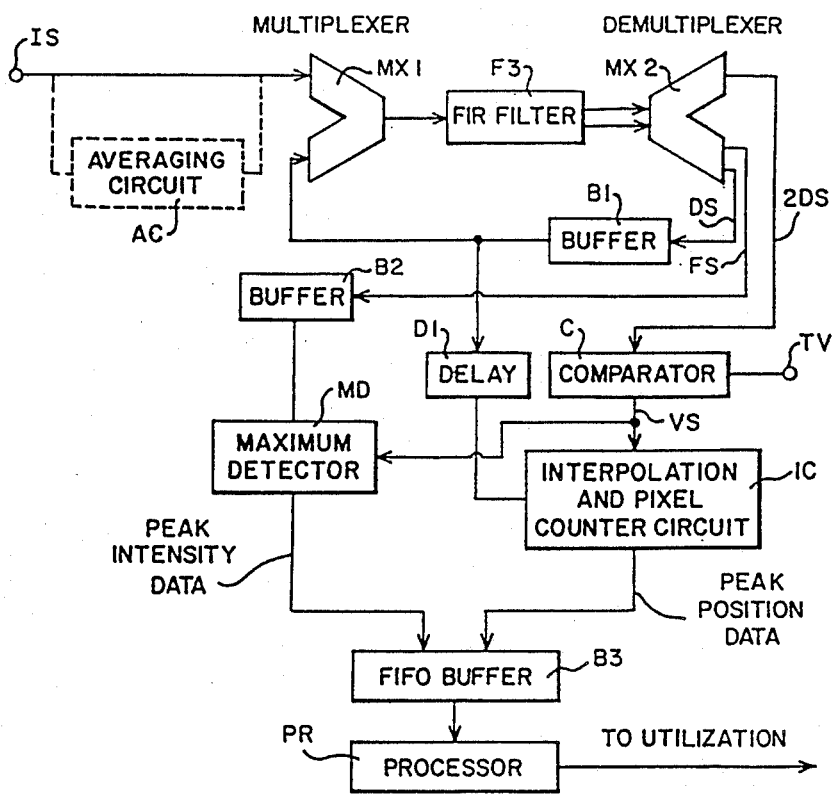
FIG. 3 is a circuit diagram of an alternative to FIG. 1, and also shows the detector embodied in an imaging system.

While the employment of a second filtering action, i.e. generation of the second derivative signal 2DS, is necessary, the use of a second filter to achieve this result is not. FIG. 3 shows an embodiment in which a single FIR filter F3 is used twice to achieve the signal 2DS. The input IS passes through a multiplier MX1 to this single FIR filter F3 which generates the output DS as before. This output DS passes through a demultiplexer MX2 to a first buffer B1 for storage while the scanning of a first line in the CCD is completed. When such scan line has been completed, i.e. after the scan line interval, the multiplexer MX1 and the demultiplexer MX2 switch over to connect the input of the filter F3 to the output of the buffer B1, and the output of the filter F3 (which is now the second derivative signal 2DS) to the comparator C for validation by comparison with the threshold value TV, as before. With this arrangement, line 2 from the CCD is not processed, because the filtering operation for generating the second derivative signal 2DS is taking place while line 2 is being received but is not being transmitted to the filter F3 by the multiplexer MX1. The next time the multiplexer and demultiplexer switch back to their orignal positions, the circuit will receive line 3. Hence only the odd-numbered lines will be processed. However, to avoid the even-numbered lines being entirely ignored, the input to the multiplexer MX1 can be preceded by a known averaging circuit AC (broken lines) which averages lines 1 and 2, then lines 3 and 4, and so on.

As before, the validation signal VS from the comparator C passes to the interpolation circuit IC to enable the same to generate the peak position data from the signal DS which the circuit IC still receives through the delay D1. In the initial position of the demultiplexer MX2, the filtered signal FS from the filter F3 passes to a buffer B2 which, after storing the data of all the peaks in the line being scanned, forwards such data, after an appropriate delay, to the maximum detector MD which also receives the validation signal VS in the same manner as in FIG. 1.

While a peak detector according to the present invention has many potential uses, one use for which such a detector is especially well adapted is for the interpretation of the data obtained by a three dimensional imaging device of the type described in M. Rioux, U.S. Pat. No. 4,645,347 issued Feb. 24, 1987, the disclosure of which is hereby incorporated herein by reference.

Figure 4:
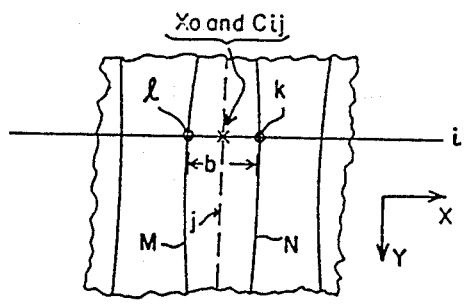
FIGS. 4 and 5 are diagrams demonstrating use of the detector in the imaging system.
Figure 5:
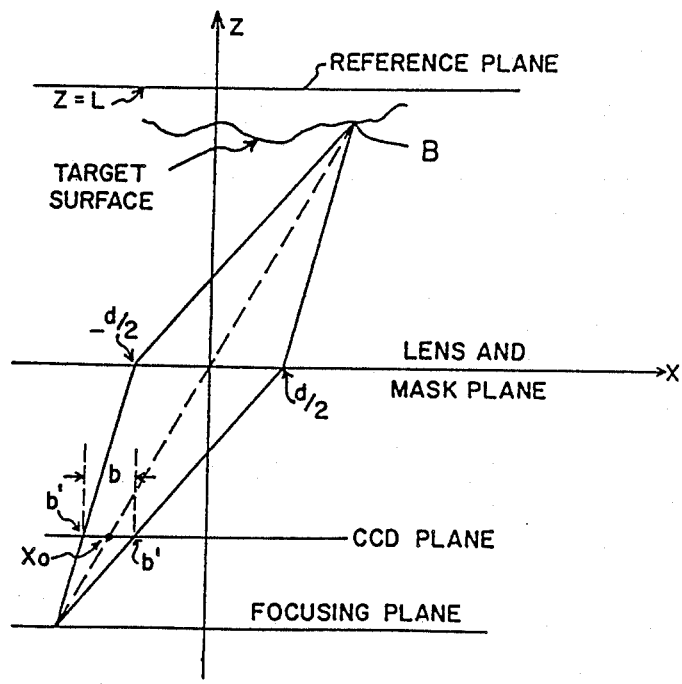

Rioux discloses an arrangement in which an imaging device employs a known, bidimensional, position sensitive light detector of the CCD type. A converging lens system images points of a target surface onto the position sensitive detector to generate data on the X and Y coordinates of each such point. Rioux provides a mask in the aperture plane of the lens system. The mask has a pair of circular apertures arranged symmetrically about the optical axis and spaced apart by a distance d (FIG. 5). The result is to form a pair of spaced-apart dots b' on the detector for each point B of the target surface, the distance b between these dots being a measure of the Z coordinate of the target point B. FIG. 4 is a reproduction on an enlarged scale of a fragment of FIG. 3 of the Rioux patent, to demonstrate typical data obtained from the CCD by the Rioux optical system. The solid vertical lines M and N represent peaks which are to be detected for a typical scan line i. The broken line j is equidistant between the lines M and N. Taking two such peaks l and k, the circuit already described in the upper part of FIG. 3 will determine their pixel positions Pil, Pik and their intensities Iil and Iik. As stated, the Z coordinate of the point B on the target surface is given by the distance b between the points b', b' that respectively form the peaks l and k; the X coordinate of the point B is given by the geometric centre Xo between points b', b'; and the Y coordinate is determined by the particular scan line in use at the time.

Referring to the lower portion of FIG. 3, it will be seen that the peak data from circuits IC and MD is fed to a Fifo (first in, first out) buffer B3 which modifies the time scale, i.e. the buffer B3 is filled in bursts, but reads out at a constant rate, this read out going to a processor PR where the peak data is interpreted and subsequent supplied to a utilization instrumentality (not shown) that may consist of one or more of a graphic 3-D display, a storage, a robot supervisor, or any other instrument requiring the 3-D imaging information. In practice, in order to achieve the necessary speed, the processor PR will conveniently consist of eight separate processing circuits operating in parallel.

The processor PR is required to take the incoming data Pil, Pik, Iil and Iik and associate the pairs of peaks, while measuring the spacing between them and determining their geometric centre point, whereby to generate the X, Y and Z coordinates for each point on the target surface.

FIG. 5 shows the geometry of the Rioux system. From this figure, we have:

$$Z = \frac{1}{L^{-1} + Kb} \quad (1)$$

$$K = \frac{L - f}{fdL} \quad (2)$$

$$X = \frac{-XoZ(L - f)}{fL} \quad (3)$$

$$Y = \frac{-YoZ(L - f)}{fL} \quad (4)$$

where
b = the separation between the two points b',
f = the focal length of the lens,
d = the separation between the mask's two apertures,
L = the distance between the reference plane and the lens, and
Xo, Yo = geometrical center of points b',
while the magnification factor (gain) is $$\frac{\delta b}{\delta Z} = \frac{-1}{KZ^2} \simeq \frac{-df}{Z^2} \quad (5)$$

Naturally equation 5 should be as large as possible. However, in a practical situation, f is given by the desired field of view, while choice of d is closely related to the numerical aperture and the focal length of the lens. It follows that precision, depth of field, field of view and the number of measurements per image are intimately related. For this reason, algorithms have been developed to increase the precision of the measurements while keeping the camera head as simple and robust as possible.

While a Vidicon type camera produces a better resolution, the use of a solid state CCD camera has several advantages, such as size, robustness, high accuracy and stability in the pixel arrangement. By orienting the mask apertures parallel to the scan lines of the CCD sensor, peak positions can be measured line by line instead of having to store the whole image prior to processing.

The detection process can be simplified by proper choice of the location of a projector (not shown) used to illuminate the target surface. Theoretically, it can be located anywhere close to the camera head. In practice, it is preferred to place the projector directly on the camera axis between the two apertures. In such an arrangement measured lines will be equally distant from the geometrical center, and this center will not be affected by the object's height, i.e. the Z coordinate.

To obtain the desired performance it is necessary
1. to measure the positions of the points on the lines (peaks) with maximum accuracy and at video rate (10 MHz),
2. to eliminate false measurements (e.g. specular reflections, ambient light, etc),
3. to associate pairs of peaks, and
4. to measure the separation b and the position Xo.

The algorithms need to operate in real time and to be simple in order to minimize the system cost.

According to Shannon's theorem, a band limited signal can be entirely reconstructed by its samples, if the sampling frequency is twice the signal's highest frequency. Since the image measured by the photo-detector is defocused, high frequency components are optically removed. It follows that CCD detectors can be used as well as Vidicon type photo-sensors, and that the sampling frequency can be reduced to the speed of the CCD. The positions of the line peaks can be measured to a fraction of a pixel.

As has already been explained, the peak positions and intensities can be measured to the necessary high accuracy by means of the circuit of FIG. 1 or preferably that of the upper portion of FIG. 3. However, overlapping peaks cannot be identified with this technique. Even sophisticated methods cannot resolve the ambiguity, resulting in a lost of dynamic range. By limiting the separation between two peaks to $$Bmin < b < Bmax \quad (6)$$

where Bmin is the minimum separation allowing no overlapping, and Bmax is the maximum separation such that two adjacent lines will not overlap either, the number of lines simultaneously projected can be reduced.

As already explained, for each line of the CCD detector the position and intensity of each peak are measured. Assuming that the projector is located between the two apertures of the mask, the theoretical position of the geometrical center point Xo for the projected line j of the CCD line i will be Cij and will be independent of the height of the object (Z coordinate). This property can be used to associate pairs of peaks and to eliminate false measurements (e.g. specular reflections). Position errors $\epsilon$ are computed by $$\epsilon ilk = \frac{Pil + Pik}{2} - Cij \quad (7)$$

where Pil, Pik are two measured peak's positions of CCD line i with the limitation that $$Bmin < Pil - Pik < Bmax, \text{ and } k < l \quad (8)$$

Then for the minimum value of $\epsilon ilk$ $$bij = \begin{matrix} (Pil - Pik) \text{ if } \epsilon ilk < \epsilon min \\ 0 \text{ otherwise,} \end{matrix} \quad (9)$$

Similarly we have $$Xoij = \begin{matrix} (Pil + Pik)/2 \text{ if } \epsilon il1 < \epsilon min \\ Cij \text{ otherwise,} \end{matrix} \quad (10)$$

$$Yoij = i, \quad (11)$$

and $$Iij = \begin{matrix} (Iil + Iik)/2 \text{ if } \epsilon ilk < \epsilon min \\ 0 \text{ otherwise} \end{matrix} \quad (12)$$

$\epsilon min$ being adjusted to compensate for optical misalignment.

Values for Bmin, Bmax, $\epsilon min$ and the expected position Cij will be set in the processor PR as part of its calibration. Hence, with an algorithm according to equations (1) to (12), the processor can solve for X, Y and Z (equations (1), (3) and (4) for each target point, given the peak position and the peak intensity data for each such point.

I claim:
1. A circuit for detecting the positions of peaks in a digital input signal, comprising
    (a) means for generating a first derivative signal of said input signal, wherein the position of each said peak is represented by a zero crossing point of said first derivative signal,
    (b) means for generating a second derivative signal of said input signal, wherein the position of each said peak is represented by a further peak,
    (c) means for generating a validation signal when the absolute value of a said further peak exceeds a threshold value, and
    (d) an interpolation circuit enabled by a said validation signal for receiving said first derivative signal for generating an output identifying the location of each said zero crossing point, each such location representing the position of a peak of the input signal.
2. A circuit according to claim 1, including a maximum detector for generating an output representing the amplitude of each peak of the input signal.
3. A circuit according to claim 2, wherein said maximum detector is enabled by a said validation signal and receives the input signal, or a filtered version thereof, from which to generate said output representing the amplitude of each peak of the input signal.
4. A circuit according to claim 1 wherein said means (a) and (b) for generating said first and second deriva- tive signals respectively comprise a pair of finite impulse response filters connected in cascade.

5. A circuit according to claim 2 wherein said means (a) and (b) for generating said first and second derivative signals respectively comprise a pair of finite impulse response filters connected in cascade.

6. A circuit according to claim 3 wherein said means (a) and (b) for generating said first and second derivative signals respectively comprise a pair of finite impulse response filters connected in cascade.

7. A circuit according to claim 1, wherein said means (a) and (b) for generating said first and second derivative signals comprise
   (e) a finite impulse response filter, and
   (f) multiplexing, demultiplexing and buffer means for alternately passing said input signal and said first derivative signal into said filter and for respectively and alternately receiving said first derivative signal and said second derivative signal from said filter.

8. A circuit according to claim 2, wherein said means (a) and (b) for generating said first and second derivative signals comprise
   (e) a finite impulse response filter, and
   (f) multiplexing, demultiplexing and buffer means for alternately passing said input signal and said first derivative signal into said filter and for respectively and alternately receiving said first derivative signal and said second derivative signal from said filter.

9. A circuit according to claim 3, wherein said means (a) and (b) for generating said first and second derivative signals comprise
   (e) a finite impulse response filter, and
   (f) multiplexing, demultiplexing and buffer means for alternately passing said input signal and said first derivative signal into said filter and for respectively and alternately receiving said first derivative signal and said second derivative signal from said filter.

10. A circuit for detecting the positions and intensities of peaks in a digital input signal having a series of scan lines spaced by a predetermined line interval, said circuit comprising
    (a) a finite impulse filter,
    (b) means for passing a first one of said scan lines through said filter to generate a first derivative signal of said first scan line wherein the position of each said peak in the input signal is represented by a zero crossing point of said first derivative signal, and, during the next scan line, for subsequently passing said first derivative signal through said filter to generate a second derivative signal of said first scan line wherein the position of each said peak in the input signal is represented by a further peak,
    (c) means for generating a validation signal when the absolute value of each said further peak exceeds a threshold value,
    (d) an interpolation circuit enabled by a said validation signal for receiving said first derivative signal for generating an output identifying the location of each said zero crossing point, each such location representing the position of a peak in said first scan line, and
    (e) a maximum detector for generating an output representing the amplitude of each peak in said first scan line.

11. A circuit according to claim 10, wherein said maximum detector is enabled by a said validation signal and receives said first scan line, or a filtered version thereof, from which to generate said output representing the amplitude of each peak in said first scan line.

12. A circuit according to claim 10, including
    (f) means for averaging the lines of each consecutive, distinct, adjacent pair of said scan lines of the input signal to generate average scan lines spaced from each other by two line intervals, said first one of said scan lines passed through the filter then being a first one of said average scan lines, and the passing of the first derivative signal through the filter taking place during the interval between the first average scan line and the next average scan line.

13. In combination with a three dimensional imaging device having means for scanning discrete images of each of a plurality of points on a target surface, wherein for each said point the spacing between said images represents a Z coordinate of said point, the geometric center between said images represents an X coordinate of said point, and the line being scanned represents a Y coordinate of said point:
    a circuit according to claim 2, further including
    (e) means for converting an output from said imaging device into said digital input signal, with said discrete images appearing as said peaks in the input signal, and
    (f) a processor connected to receive said outputs from the interpolation circuit and the maximum detector for generating therefrom data identifying the X, Y and Z coordinates of each said point on the target surface.

14. In combination with a three dimensional imaging device having means for scanning discrete images of each of a plurality of points on a target surface, wherein for each said point the spacing between said images represents a Z coordinate of said point, the geometric center between said images represents an X coordinate of said point, and the line being scanned represents a Y coordinate of said point:
    a circuit according to claim 10, further including
    (g) means for converting an output from said imaging device into said digital input signal, with said discrete images appearing as said peaks in the input signal, and
    (h) a processor connected to receive said outputs from the interpolation circuit and the maximum detector for generating therefrom data identifying the X, Y and Z coordinates of each said point on the target surface.

15. The combination of claim 13, wherein said processor solves the equations $$Z = \frac{1}{L^{-1} + Kb}$$

$$X = \frac{-X_o \, Z(L - f)}{fL}$$

$$Y = \frac{-Y_o \, Z(L - f)}{fL}$$

where
   X, Y and Z are said coordinates and
   b is said spacing between images,
   f is the focal length of a lens in the imaging device,
   L is the distance in the Z direction between a reference plane and the lens, and
   Xo and Yo are the X and Y coordinates of the geometrical center of said images.

16. The combination of claim 14, wherein said processor solves the equations $$Z = \frac{1}{L^{-1} + Kb}$$

$$X = \frac{-X_o Z(L-f)}{fL}$$

$$Y = \frac{-Y_o Z(L-f)}{fL}$$

where
- X, Y and Z are said coordinates and
- b is said spacing between images,
- f is the focal length of a lens in the imaging device,
- L is the distance in the Z direction between a reference plane and the lens, and
- $X_o$ and $Y_o$ are the X and Y coordinates of the geometrical center of said images.

17. In combination with a three dimensional imaging device having means for scanning discrete images of each of a plurality of points on a target surface, wherein for each said point the spacing between said images represents a Z coordinate of said point, the geometric center between said images represents an X coordinate of said point, and the line being scanned represents a Y coordinate of said point:

a circuit for detecting the positions and intensities of peaks in a digital signal representing said images, said circuit further including
  (a) means for converting an output from said imaging device into said digital input signal, with said discrete images appearing as said peaks in the input signal, and
  (b) a processor connected to receive data representing said positions and intensities for generating therefrom the X, Y and Z coordinates of each said point on the target surface.

18. The combination of claim 17, wherein said processor solves the equations $$Z = \frac{1}{L^{-1} + Kb}$$

$$X = \frac{-X_o Z(L-f)}{fL}$$

$$Y = \frac{-Y_o Z(L-f)}{fL}$$

where
- X, Y and Z are said coordinates and
- b is said spacing between images,
- f is the focal length of a lens in the imaging device,
- L is the distance in the Z direction between a reference plane and the lens, and
- $X_o$ and $Y_o$ are the X and Y coordinates of the geometrical center of said images.

* * * * *